United States Patent [19]

Wronski et al.

[11] Patent Number: 4,502,823
[45] Date of Patent: Mar. 5, 1985

[54] BROKEN DRILL BIT DETECTOR

[75] Inventors: Steve Wronski, Shoreview; John E. Albright, St. Paul, both of Minn.; Jeffrey J. Carlson, Las Cruces, N. Mex.

[73] Assignee: Sperry Corporation, New York, N.Y.

[21] Appl. No.: 332,581

[22] Filed: Dec. 21, 1981

[51] Int. Cl.$^3$ ............................ B23C 9/00; H01J 5/16; B23B 47/24

[52] U.S. Cl. .................................. 409/134; 250/221; 250/561; 356/375; 408/6; 408/11; 408/16

[58] Field of Search ............... 408/6, 11, 16; 364/507; 409/134, 131, 187, 194; 318/563, 565, 480; 250/221, 341, 261, 561; 356/375, 384, 387, 400

[56] References Cited

U.S. PATENT DOCUMENTS

| | | | |
|---|---|---|---|
| 3,906,232 | 9/1975 | Miehofer | 250/341 |
| 3,912,925 | 10/1975 | Gaskell | 250/221 X |
| 4,012,635 | 3/1977 | Walter et al. | 250/221 |
| 4,019,606 | 4/1977 | Caputo et al. | 318/480 X |
| 4,029,957 | 6/1977 | Betz et al. | 250/221 |
| 4,266,124 | 5/1981 | Weber et al. | 250/221 |
| 4,272,762 | 6/1981 | Geller et al. | 250/221 X |
| 4,335,316 | 6/1982 | Glanz et al. | 250/221 X |
| 4,340,326 | 7/1982 | Buonauro et al. | 408/16 |

Primary Examiner—William R. Briggs
Attorney, Agent, or Firm—Charles A. Johnson; Kenneth T. Grace; Marshall M. Truex

[57] ABSTRACT

A Drill Bit detector for use with numerically controlled drilling machine capable of sensing missing or broken Drill Bits in the range of 1 mil to 30 mils in diameter, or larger, is described. An infrared emitting diode is driven at a predetermined frequency with the pulsed light being directed through fiber optic cable directed at a portion of the Drill Bit to be detected. A change of light intensity occurring when a Drill Bit is missing is detected and the pulsed light detected converted to a pulsating electrical signal at the input frequency of the pulse light source. A frequency responsive circuit converts the pulsating electrical circuit to a digital signal indicative of the absence of the sensed Drill Bit. A timer determines whether or not the sensed digital signal occurs for a predetermined threshold time period, and causes it to be ignored as spurious if less than the predetermined time interval, or causes the drilling machine operation to be halted if occurring longer than the threshold time period. Multiple detection circuits are illustrated for use with most multiple drill spindles.

6 Claims, 13 Drawing Figures

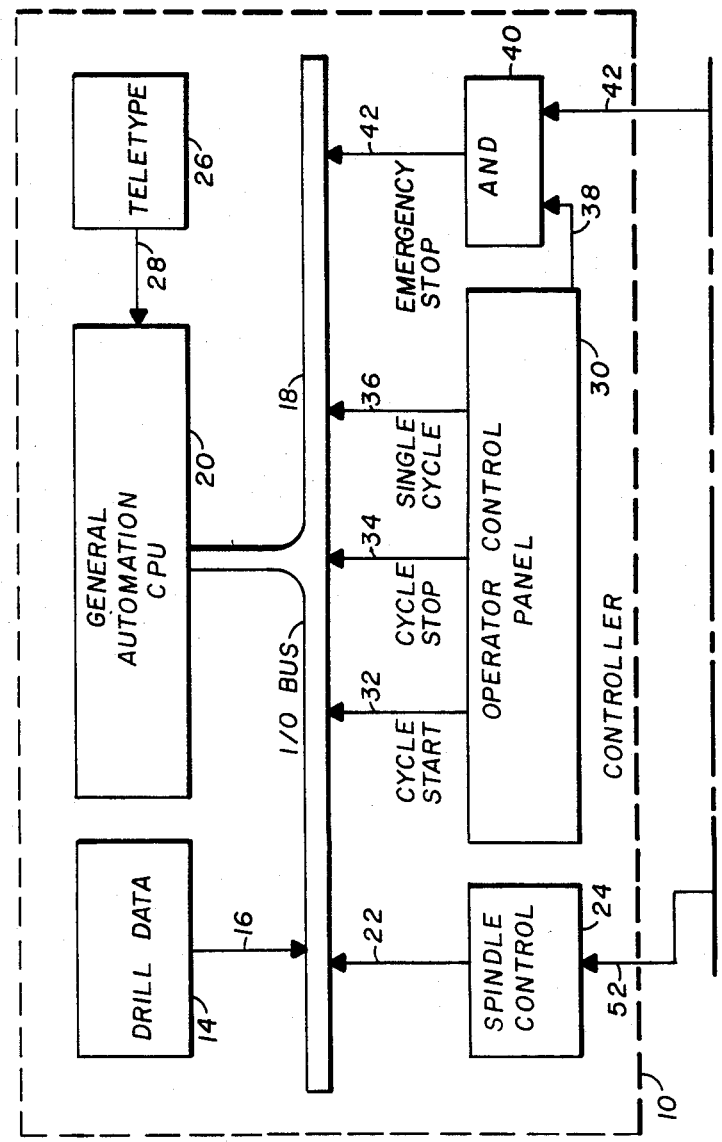

D = EMITTER DIAMETER
d = DRILL DIAMETER

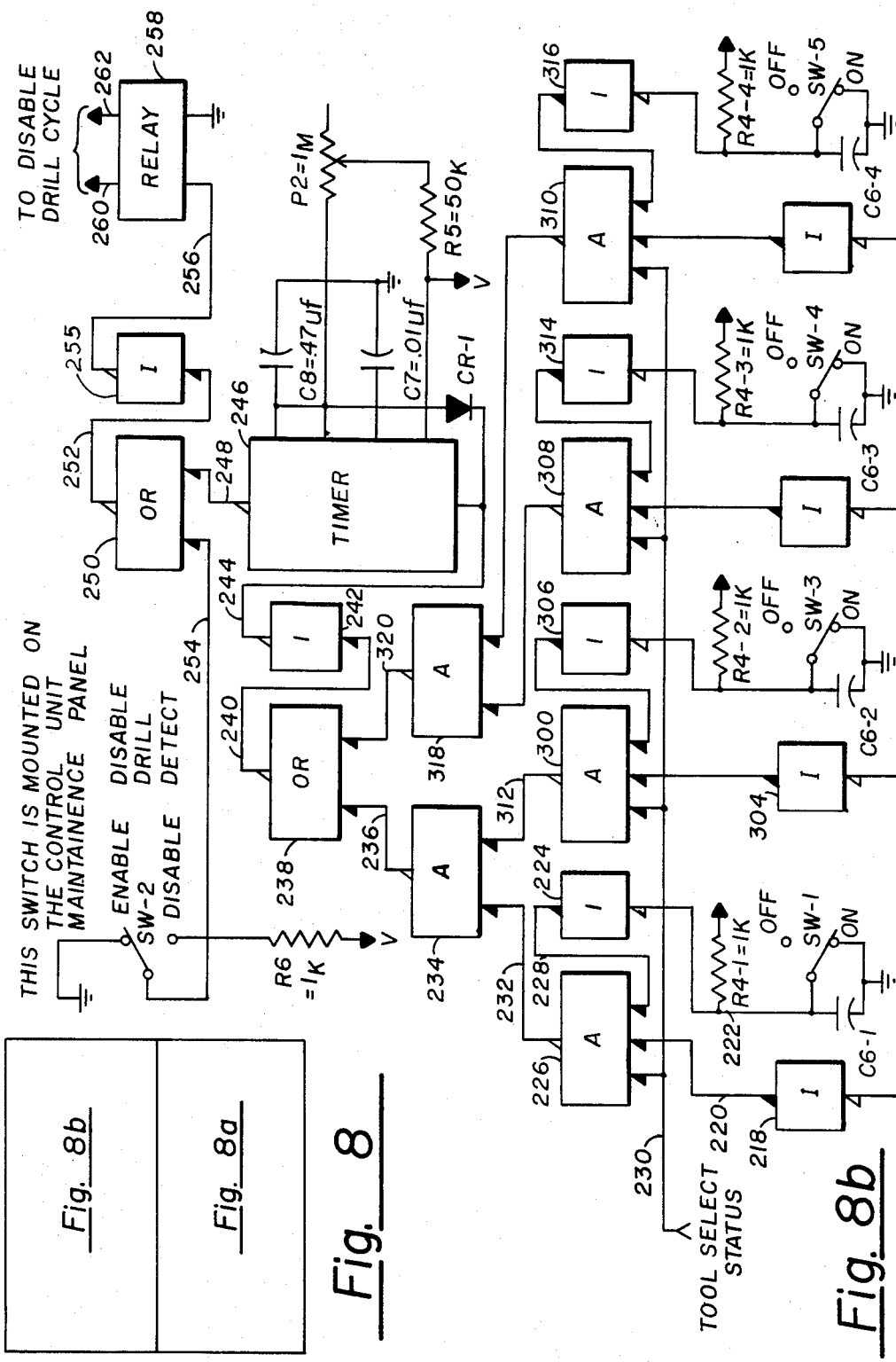

BROKEN DRILL BIT DETECTOR

BACKGROUND OF THE INVENTION

1. Field of the Invention

This invention relates to control apparatus for use with numerically controlled drilling machines; and, more particularly, to a system for detecting and signaling the occurrence of broken or missing Drill Bits.

2. State of the Prior Art

Numerically controlled machine tools have been used for some time to increase the efficiency of generation of precision parts. It has been recognized that monitoring of the operation of such tools leads to an even greater efficiency in production of parts due to the minimization of preparation of faulty parts through a malfunction of the machine tool, and repair of malfunctions as they occur.

Numerically controlled Drilling Machines in general have control mechanisms for controlling the movement of Drill Chucks in relationship to a workpiece to be drilled, and control apparatus for positioning the workpiece that is being drilled to the precise location where the drilling operation is to occur. It is common to have the drilling machines operate in cycles wherein the control positions the workpiece, actuates the drilling operation, and signals a completion of the drilling operation, thereby ending that drilling cycle. The next drilling cycle can then be initiated, as determined by the numerical control signals applied.

The size of the holes to be drilled can vary over a wide range. For example, in the electronics industry, drilling of parts characteristically extends over the range of hole sizes of 30 mils in diameter to hole sizes in excess of 0.25 inch in diameter. In other industries and technologies, obviously even larger hole sizes are drilled. As the effort for further miniaturization in the electronics industry has progressed, it has been found to be necessary to drill holes of less than 30 mils in diameter. As integrated circuitry packages have been decreased in size it has become necessary to drill holes in the range of 1 mil to 20 mils in diameter for purposes of mounting the integrated circuit leads to printed circuit boards. Further, with decrease in circuit size, there has occurred an increase in the density of circuit mounting to multi-layer printed circuit boards. For example, it is common to have multi-layer printed circuit boards that are approximately one foot by one foot square, having as many as 20,000 holes drilled therein.

The hole location and drilling control instructions are often formed by computer program, and do not necessarily result in the holes being drilled in uniform pattern, nor in immediate progressive sequence. That is, holes may be drilled in various sections of the printed circuit board in sequential drilling operations. Accordingly, if a Drill Bit breaks and it is not detected, the workpiece may be moved to a position that renders it virtually impossible to back up to the point where the last good hole was drilled to again proceed once the Drill Bit has been replaced. Because of this repositioning problem, one alternative is to simply scrap the printed circuit board that is not completely drilled without breaking a Drill Bit. This obviously is an expensive alternative. In these extremely small diameter drill operations, it often occurs that just the tip of the bit breaks off. Since the Drilling Machine often utilizes a pressure foot to engage the workpiece before the drill is applied for drilling the hole, the Drill Bit is in a position that makes it very difficult to view visually, and to the extent that it can be viewed, it is difficult to determine visually when only a small portion of the Drill Bit has broken off.

Various attempts at solving the detection of broken Drill Bits in this extremely small size range utilizing concepts that work adequately for larger Drill Bits have been tried and found unworkable.

One attempted solution was to encircle the Drill Bit with coils of wire coupled to circuits attempting to sense the difference in inductance that occurs between the presence of a Drill Bit and the absence thereof. Due to the very small sizes of the drills and the fact that very small portions thereof may break off, inadequate signal changes for reliable detection were available. Further, proximity coils that would adequately accommodate the varying sizes of Drill Bits would render the system unacceptable.

Standard incandescent light sources with photoelectric interrupters were also considered. Again, the very fine drill size resulted in inadequate sensing of the interruption. Further, the portions of the Drilling Machine including the pressure foot, the spindle, the drive, and the like that are in the area of sensing would have to be coated with material to minimize reflection in order for the system to work. It was found also that when the operator checked the work operation using a flashlight to obtain additional illumination, the photoelectric system tended to malfunction.

In drilling systems utilizing larger Drill Bits, the power driving the drive motor can be sensed and the change in electrical load detected when the drill bit entered the workpiece. If the Drill Bit is broken or missing, there is no change in the motor load, thereby indicating a broken or missing Drill Bit condition. In practical operation, Drill Bits of the size contemplated do not produce sufficient load change to be reliably monitored for stopping operation for a broken Drill Bit.

Another system utilized with larger Drill Bits is a mechanical detection finger that simply is caused to move forward at the start of the drilling operation until it impinges on the Drill Bit. If stopped by the Drill Bit, it senses a good or drilling condition and the cycle is allowed to continue. If the Drill Bit is broken, the sensing mechanical feeler extends farther and indicates that the Drill Bit was broken. Mechanical sensing devices of this type actually tend to break small Drill Bits, and being mechanical in nature are difficult to mount on the numerically controlled Drilling Machine pressure foot, hence are unacceptable solutions to the problem.

Still another system considered was the use of the Drill Bit and the Conductor on the printed circuit board as a switch assembly. To accomplish this, the Drill Bit must be electrically isolated from the printed circuit board. A sensing circuit applied to the Drill Bit and the Conductor surface on the printed circuit board would then indicate a switching condition if the Drill Bit pierced the Conductor on the printed circuit board. Due to the extremely small diameter of the Drill Bit, a buildup of the epoxy being drilled would essentially isolate the Drill Bit from the Conductor, thereby tending to give false indications that the Drill Bit is missing.

For each of the foregoing items mentioned, the situation is particularly aggravated by the vibration and the contamination of the drilling environment.

SUMMARY OF THE INVENTION

With the foregoing in mind, the present invention provides an improved Drill Bit detecting system for use in numerically controlled Drilling Machines. The invention utilizes a support member for mounting to the numerically controlled Drilling Machine in the vicinity of the Drill Bit to be detected. To the support member is mounted an emitter for emitting pulsed light at a predetermined frequency, with the pulsed light being directed through a fiber optic cable and directed toward a predetermined portion of the Drill Bit to be detected. A second fiber optic cable is positioned in a predetermined location with respect to the output of the first optical cable for sensing the pulsed light. A detector circuit is mounted on the support device, and is coupled to the second optical cable for detecting changes in light intensity occurring when the detected Drill Bit is not present in the path of the pulsed light. The detector circuit converts the detected light pulses to electrical pulses occurring at the same frequency, with the amplitude of the electrical signals being determined by the amplitude or intensity of the light pulses. A frequency responsive circuit is coupled to the detector circuit and converts the electrical signals to a digital signal level when the detected light pulses are present, thereby indicating that the detected Drill Bit is broken or missing. This digital signal is available to drive circuitry that will cause the drilling machine operation to be halted. When extremely fine drill bits are used, spurious signals are sometimes caused to occur because of skew in the drill bit. A timing circuit is utilized in conjunction with the frequency responsive circuit such that the disable signal must occur for a predetermined time threshold in order to cause the disable signal to be applied to the drilling machine to cause it to halt its operation. Disable signals that occur for less than the predetermined time interval are considered as spurious and ignored. Multiple detection circuits can be utilized with multiple drill spindles utilizing identical circuitry with each of the emitter circuits driven by a signal source having a predetermined distinct different frequency from all other drive sources.

OBJECTS OF THE INVENTION

A primary object, then, of this invention is to provide an improved broken or missing drill bit detector for use with numerically controlled drilling machines. Yet another object is to minimize operator time to reinstitute drilling process upon a detected occurrence of a broken drill bit.

Still a further object is to eliminate the need to search for the last properly drilled hole and to eliminate the need to reposition numerical control information back to the last properly drilled hole upon the occurrence of a broken drill bit.

Yet a further object is to minimize scrap requirements of printed circuit boards being drilled on a numerically controlled drilling machine occurring because of broken drill bits.

Another object is to provide a broken drill bit detector that will detect a broken drill bit having a diameter of less than 30 mils.

Still a further object is to provide a broken drill bit detector that will operate reliably in the vibration and contaminated environment of a numerically controlled drilling machine.

Another object is to provide a cost-effective broken drill bit detector that can be constructed from commerically available components.

Still a further object is to utilize a pulsed light source directed through a fiber optic cable focused on a predetermined portion of a drill bit to be detected, in combination with a detector that will detect the change in light intensity occurring when a drill bit having a diameter less than 30 mils is missing from the light path and provide a controlling signal for disabling the numerically controlled drilling machine to which it is affixed.

Still a further object is to provide a broken drill bit detector that will not respond to spurious signals that may occur from drill bit skew to shut down the operation of the drilling machine.

These and other more detailed and specific objects and objectives will be more clearly understood from a consideration of the drawings and the description of the preferred embodiment.

BRIEF DESCRIPTION OF THE DRAWINGS

FIG. 1, comprising FIGS. 1a and 1b, is a simplified block diagram of a numerically controlled drilling machine and a broken or missing drill bit detector of the subject invention.

FIG. 8a through FIG. 8b, when arranged as shown in FIG. 8, comprise a logic circuit diagram of a preferred embodiment of the invention wherein multiple emitter/detector apparatus is utilized for controlling multiple drill bit detections.

DESCRIPTION OF THE PREFERRED EMBODIMENT

Figure 1A:
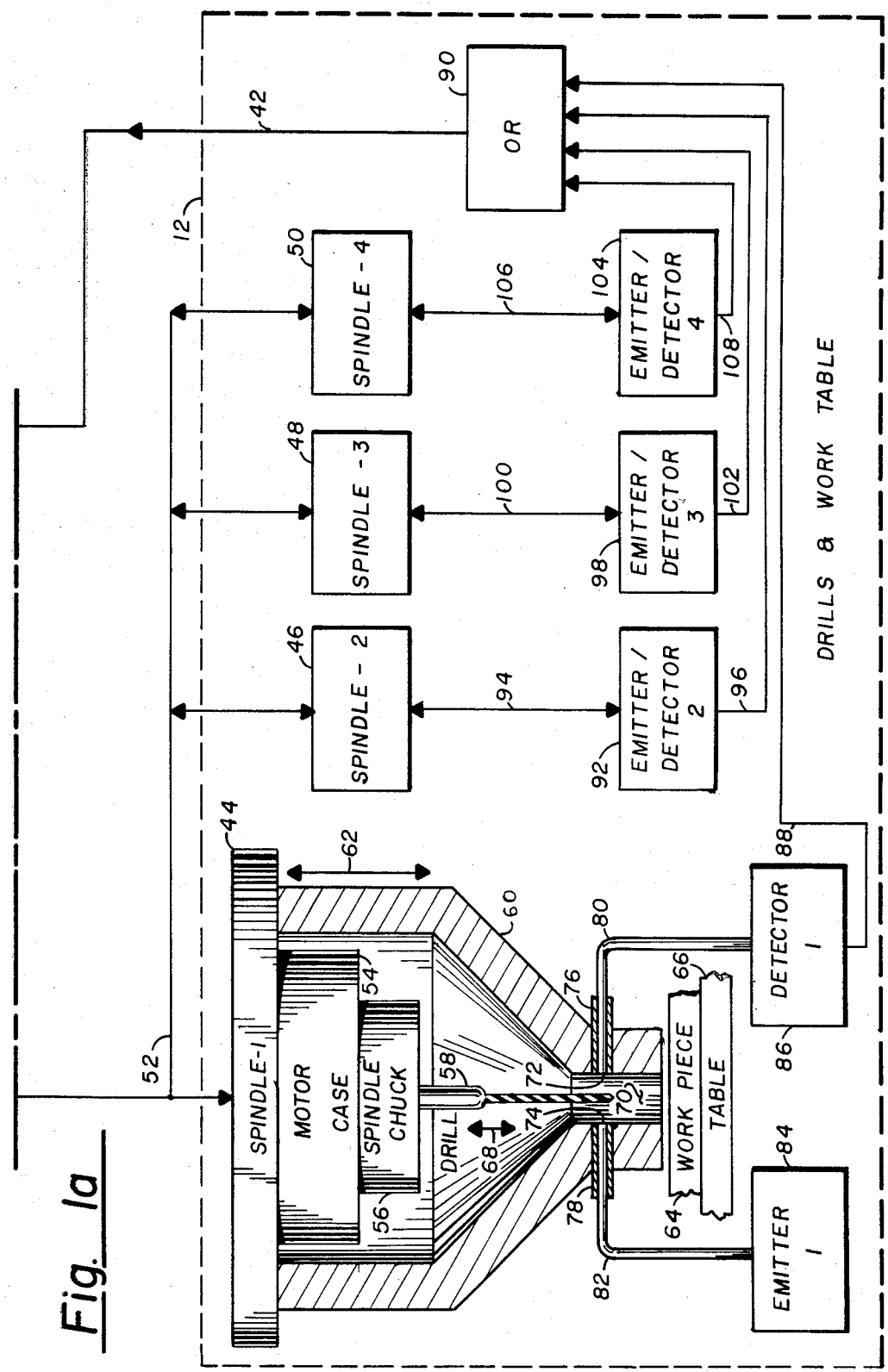

FIG. 1 is a simplified block diagram of a numerically controlled drilling machine and a broken or missing drill bit detector. The subject invention can be utilized with any numerically controlled drilling machine that has a control path that allows immediate interruption of drill positioning and operation when a broken or missing drill bit is detected. The subject invention has been adapted for use with a commercially available numerically controlled drilling machine identified as the Excellon Mark III available commercially from Excellon Automation Division, Excellon Industries. It is understood that reference to broken drill bits will include missing drill bits unless otherwise described. For purposes of discussion, the automatic numerically controlled drilling machine will be considered to be comprised of two major portions, the Controller being shown enclosed in dashed block 10, and the Drills and Work Table shown enclosed in dashed block 12. The Controller 10 includes a source of Drill Data 14 which identifies the control information necessary for positioning the Drills and Work Table 12 for defining the holes to be drilled. The Drill Data 14 is provided on line 16 to the Input/Output Bus (I/O Bus) 18, which is the common transmission path for the Controller. The General Automation CPU 20 responds to the Drill Data and issues commands on line 22 to the Spindle Control 23, thereby controlling the raising and lowering of the associated Spindles. A Teletype 26 provides a means of input via line 28 to the CPU 20. The Operator Control Panel 30 provides visual indications of the status of operations of the numerically controlled drilling machine, has manual switches for starting and stopping operation, and includes controls for issuing certain types of manually controlled operations. Portions of these Operation Control Panel functions that are particularly relevant to the invention will be described in detail below. In general, there are controls that allow starting and stopping of machine, as indicated by the Cycle Start control signal issued on line 32 and the Cycle Stop signal issued on line 34. There is also provision for a Single Cycle selection providing signals controlling that operation on line 36.

When the broken drill bit detection circuitry is enabled by setting of a manual switch on the Operator Control Panel 30, an enabling signal is provided on line 38 to AND circuit 40. The output from AND circuit 40 on line 42 provides an Emergency Stop signal to the I/O Bus when a broken drill bit occurrence is detected and a signal received on line 42.

The Drills and Work Table shown enclosed in dashed block 12, illustrates four Spindles identified as Spindle 1, labeled 44; Spindle 2, labeled 46; Spindle 3, labeled 48; and Spindle 4, labeled 50. It should be understood that the subject invention can be utilized with a single spindle numerically controlled drilling machine as well as with multiple Spindle machines. The Spindle Control 24 is in two-way communication with each of the Spindles via line 52, with control signals flowing to the Spindles for raising and lowering and positioning, and flowing from the Spindles indicating when specified operations have been completed. The detail operations of the control of the Spindles need not be considered in detail, since it does not add to an understanding of the invention.

Associated with Spindle 1, is a Motor Case 54 that drives a Spindle Chuck 56 in which the Drill 58 is mounted. The Pressure Foot 60 is shown in cut away section and should be understood to completely surround the Spindle Check and Drill. The Pressure Foot 60 raises and lowers as indicated by arrow 62 and comes in contact with the Work Piece 64 which is supported on the Drill Table 66. Similarly, the Drill 58 moves up and down as indicated by arrow 68 for drilling the Work Piece at specified locations. The Pressure Foot 60 has a Collar portion 70 at its lower extremity. A pair of axially aligned holes 72 and 74 are made in Collar 70. Cylindrical Casings 76 and 78 are inserted in holes 72 and 74, respectively, and can be syringe tube or similar and are selected of a size to accommodate insertion of Fiber Optic Cables 80 and 82 respectively. Fiber Optic Cables 80 and 82, are glass, covered with opaque covers and are of a type available commercially. Emitter 1, labeled 84, is coupled to Fiber Optic cable 82 and provides a source of energy into Collar 70. Detector 1, labeled 86, is coupled to Fiber Optics cable 80 and detects the state of energy in Collar 70. The energy detected will be altered depending upon the presence or absence of Drill 58, thereby indicating whether or not the Drill 58 is broken or missing. Upon detecting absence of the Drill 58, a signal is issued on line 88 to OR circuit 90, which then issues the Emergency Stop indicating signal on line 42 to AND circuit 40. In a similar manner, Spindle 2 has Emitter/Detector 2 labeled 92, coupled thereto via line 94. Upon detecting absence of the drill associated with Spindle 2, a signal is issued on line 96 to OR circuit 90. In a similar manner Spindle 3 communicates with Emitter/Detector 3, labeled 98, via line 100 and provides the control signal on line 102; and Spindle 4 communicates with Emitter/Detector 4 labeled 104, via line 106 for providing the control signal on line 108. Thus it can be seen that the detection of a broken drill in any of the associated Spindles will result in OR 90 issuing the Stop signal on line 42, thereby causing the numerically controlled drilling machine to stop operation immediately at the location where the broken drill bit is detected, thereby allowing it to be replaced and the operation to commence from the point of malfunction. It can be seen that there is no need for any hunting to reposition the machine for holes that were not drilled, nor is there any need to discard work pieces for which holes may not have been properly drilled as is the case of drilling systems that do not utilize the subject invention.

The positioning of axially aligned apertures 72 and 74 is such that the Fiber Optic cables 80 and 82, which can be parts of Spectronics SPX4640-XYZ, are positioned very close to the tip of Drill 58. The subject invention will detect missing drill bits of small diameter, for example in the range of 1 to 30 mils. It is desirable to have this positioning since the Drill 58 may break off at the tip and still appear visually to be present, due to the extremely small diameters of the drills involved. A drill with a broken tip may cause excessive burring of the work piece, or may fail to drill to the required depth. The invention can also be utilized with larger diameter drill bits.

Figure 2:
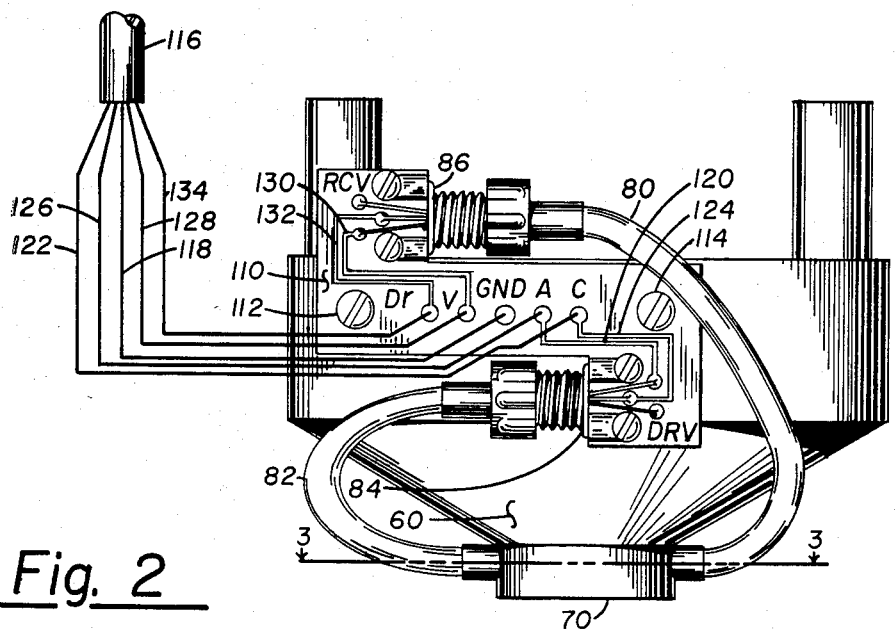
FIG. 2 is a elevation view of the pressure foot of a numerically controlled drilling machine with the sensing portion of the subject invention mounted thereto.

FIG. 2 is an elevation view of the pressure foot with the subject invention mounted thereto. A Printed Circuit Board 110 is mounted to a surface of the Pressure Foot 60 by screws 112 and 114. An Emitter 84, which can be a Spectronics SPX4689-003, available commercially, is physically mounted to Printed Circuit Board 110. The Emitter for the preferred embodiment of the invention comprises an Infra Red Emitting Diode (IRED) capable of turning completely on and off at extremely high rates, and having a life expectancy in excess of 100,000 hours. The type of Emitter selected has a low power consumption and is durable and reliable in mechanical stress and vibration environment. The pulsed light output of Emitter 84 is passed through Fiber Optic cable 82 into Collar 70. The light passing through Collar 70 into Fiber Optic cable 80 and is applied to Detector 86, which is physically mounted to Printed Circuit Board 110. The Detector 86 is matched to the operational parameters of the Emitter 84, and for this embodiment can be a Spectronics No. SPX4693-002. The use of the pulsed light source provides an advantageous operation in that it minimizes the effects of ambient light on the Detector, thereby providing sensitivity to the extremely fine interruptions of the light source by the Drill 58.

The actual drive and control circuitry is mounted on an interface printed circuit board (not shown) and will be described in detail below. A Cable 116 brings power and drive to the Printed Circuit Board 110 and takes the detection signal to the central circuitry for use in controlling the numerically controlled drill operation. The electrical connections from cable 116 to the Printed Circuit Board 110 is accomplished with Super-Flex wire, which accommodates the upward and downward movement of the Pressure Foot 60 without exhibiting undue fatigue or breakage. The Fiber Optic cables 80 and 82 are mounted directly to the Pressure Foot 60 and move up and down with it, hence are not subjected to flexing and results in a reliable operation. Glass Fiber Optic cables having glass optical ends in the work area are reliable and continue to have good light beam response even after being subjected to drilled residue for extended periods of time.

Positive power is applied on wire 118 to Terminal A, which in turn provides power on printed circuit line 120 to the Emitter. The source of drive pulses is coupled over wire 122 to Terminal C which in turn provides the drive signals to the Emitter 84 over printed circuit line 124. Circuit Ground is provided on wire 126 to the GND Terminal. Power to drive the Detector 86 is provided on wire 128 to the V Terminal, which directs it on a printed circuit path 130 to the Detector. The drive signal provided by Detector 86 passes on printed circuit path 132 to the Dr Terminal and is carried on wire 134 to the control circuitry.

Figure 3:
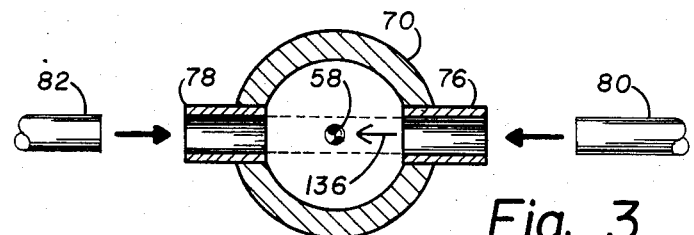
FIG. 3 is a cutaway view taken along line 3—3 in FIG. 2, and illustrates the alignment of the optical emitting and sensing cables.

FIG. 3 is a cut away view taken along line 3—3 in FIG. 2, and illustrates the mounting of the Cylinders 78 and 76 in the Collar 70. Cylinders 76 and 78 are adapted to extend beyond the outer rim of Collar 70, and provide a supporting mechanism for the ends of the Fiber Optic cables 80 and 82, respectively. The Cylinders can be for example 20 gauge hollow syringe tubing inserted in the apertures in Collar 70 and affixed in place as by use of adhesives. The ends of the Fiber Optic cables 80 and 82 are optically polished and must be inserted in axial alignment in a manner to be properly aligned across the width of the Drill 58. The ends of Fiber Optic cables 80 and 82 are inserted in the direction of the arrows in mounting Cylinders 76 and 78 respectively, and are affixed in place as by use of an adhesive. For an embodiment, the Fiber Optic cables are selected to be 20 mil diameter cables. The spacing between the optical ends of Fiber Optic cables 80 and 82 must be such that it will accommodate the largest drill size to be utilized. A spacing of 0.25 inch for use with Drill bit diameters in the range of 1 mil to 30 mils has been found to given advantageous operation. For embodiments where the Drill diameter is to be in the 10 to 15 mil range for many operations, a Fiber Optic diameter of approximately 10 mils provides good signal ranges.

Figure 4:
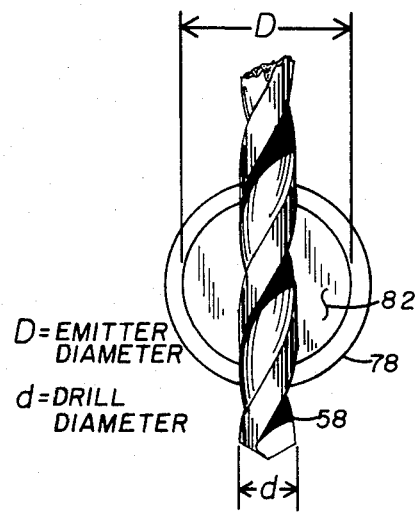
FIG. 4 is a diagramatic elevation view of a drill bit and the end of one of the fiber optic cables.

FIG. 4 is a diagrammatic elevation view of the drill bit and the end of the Fiber Optic cable taken in the direciton of arrow 136 in FIG. 3. For arrangements where the Detector Fiber Optic cable 80 has substantially the same diameter as that of the Emitter Fiber Optic cable 82, the relative light insensity (IR) at the Detector is approximately proportional to the ratio of the area of the Emitter Fiber Optic output, to that area unblocked by a drill bit in position. This relationship is shown in the following Equations.

$$I_R = I/I_O \quad \text{(Equation 1)}$$

where
$I_R$ = Relative Intensity
$I_O$ = Output Intensity of Emitter
$I$ = Intensity of Output Reduced by Drill Blockage
For Detector diameter D and emitter diameter d in mils $$I_R = A/A_E \quad \text{(Equation 2)}$$

where
$I_R$ = Relative Intensity
$A_E$ = Area of Emitter Output
$A$ = Area of emitter output less area shielded by Drill $$I_R = \frac{2\left(D^2 \cos^{-1}\frac{d}{D} - d\sqrt{D^2 - d^2}\right)}{\pi D^2} \quad \text{(Equation 3)}$$

The foregoing relationships assume that the Drill 58 is substantially centered across the output of the Emitter Fiber Optic cable 82, and can be seen to be a relationship of circle segment area to total circle area. The optimal detection situation occurs when the Emitter light output is totally shielded from the Detector by the Drill. Since the system and drilling requirements can accommodate different drill sizes, the optimal condition cannot always be utilized. The control signal differential, then, results from the difference in detected intensity of the light occurring when the Drill blocks all or a portion of the emitted light versus the light intensity detected in the absence of the Drill Bit. This change in light intensity is detected by the Detector 86 and converted to an electrical signal for driving the control circuitry.

Figure 5:
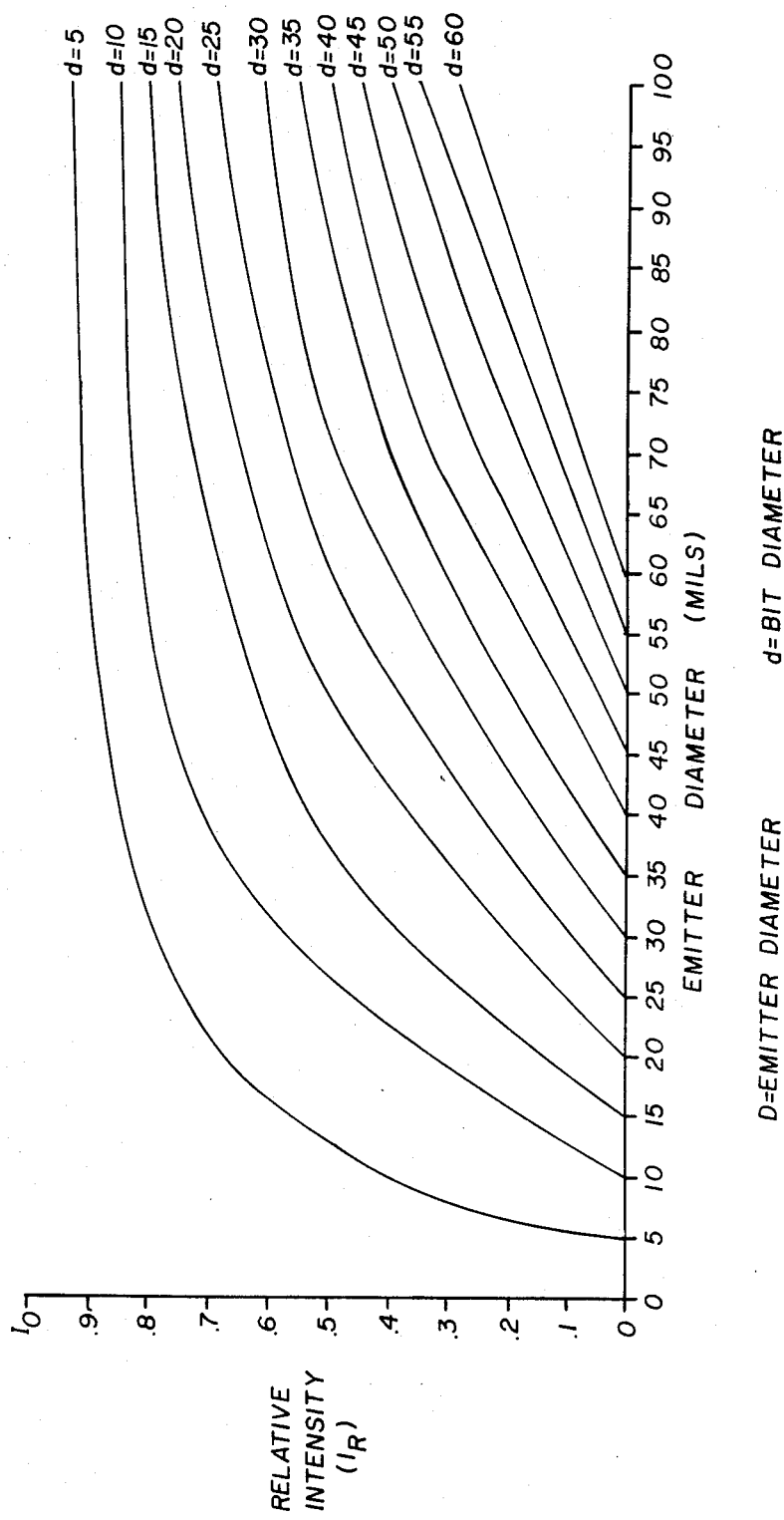
FIG. 5 is a plot of changes in relative light intensity or different drill diameter sizes and varioius emitter fiber optic diameters.

FIG. 5 is a plot of various Drill diameters 'd' versus various Emitter Diameters 'D'. To illustrate a characteristic design situation, assume that the Emitter Diameter 'D' is 20 mils, and a Drill diameter 'd' of 10 mils is to be controlled. The graph illustrates that the Relative Intensity $I_R$ is approximately 39 percent of maximum when the Drill is present and blocking a portion of the applied light. Thus, the signal level available when the Drill bit is present would rise approximately 60 percent over the signal occurring when the Drill partially blocks the light upon the removal of the Drill from the light path, thereby providing adequate voltage change to detect a missing Drill reliably. The circuits for accomplishing the detection will be described in more detail below.

Figure 6:
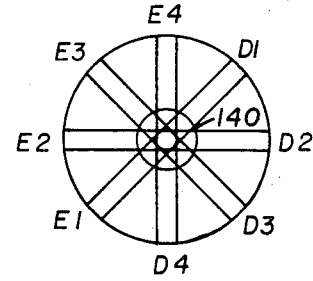
FIG. 6 illustrates the increase in the absolute detection area when multiple emitter/detectors are utilized for a single drill bit.

FIG. 6 illustrates graphically the increase in the absolute detection area when multiple Emitter/Detector pairs are utilized. As illustrated, there are four Emitters E1, E2, E3 and E4 arranged with respectively associated Detectors D1, D2, D3 and D4. The area of beam overlap is illustrated by circle 140, and indicates that a Drill anywhere within the circle would cause interruption of one or more of the beams. Associated circuitry (not shown) of a type similar to that described above and to be described electronically below, operates to evaluate the changes in signal levels occurring when a Drill bit is absent, to cause the drill machine to be stopped only when all of the Emitter/Detector pairs indicate absence of the Drill. If any pair detects the presence of the Drill, the machine operation will not be stopped. It can be seen that the diameter of the absolute detection area within circle 140, increases linearly with the number of pairs.

Figure 7:
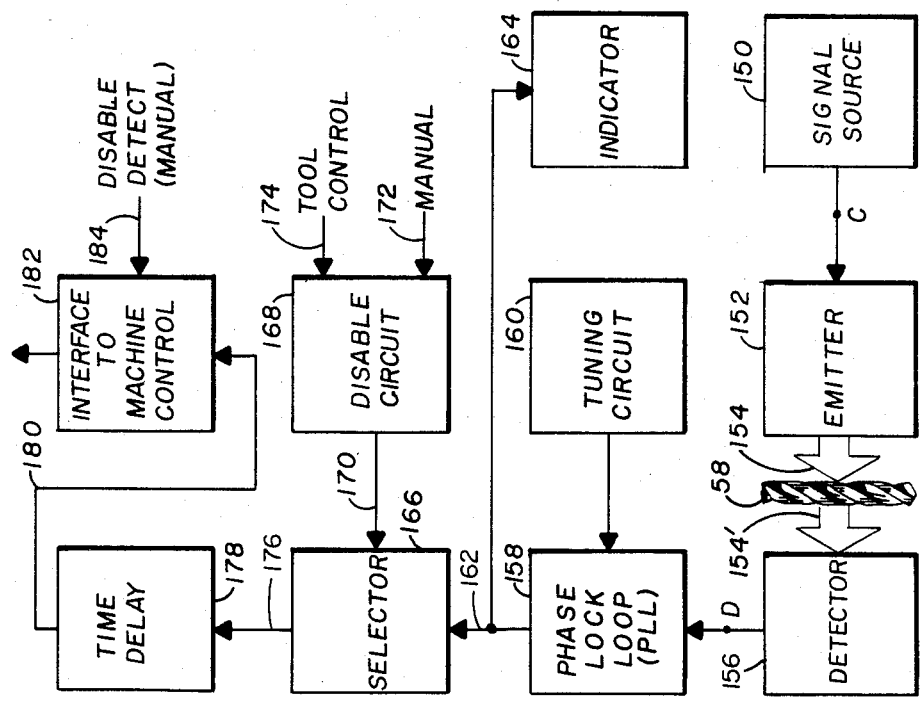
FIG. 7 is a block diagram of the broken drill bit detector of the invention.

FIG. 7 is a block diagram of a broken drill bit detector of the subject invention. A Signal Source 150 is utilized to provide drive signals at a predetermined frequency to Terminal C. The Signal Source for the preferred embodiment is an Oscillator operable at a fixed predetermined frequency. The drive signals are applied to Emitter circuitry 152, which operates to provide a pulsed beam of light 154 having a predetermined frequency. The beam of light is directed to Drill 58, which functions to block all or some portion of the beam of light. When Drill 58 is not in the light path, the beam of light 154' is directed to the Detector 156. The Detector provides a first signal to Terminal D when Drill bit 58 is present. The first signal is a system enabling signal rendering the remainder of the control circuitry inoperative for shutting down the numerically controlled drilling machine since the Drill is present. The Detector provides a second signal which can be considered to be a disabling signal, when the Drill is missing, said second signal having a predetermined relationship to the frequency of the drive signal. The output signals from the Detector 156 are applied to a Phase Lock Loop circuit (PLL) 158, which can be a Type 567 PPL available commercially. The PLL circuit is tuned to be responsive to the frequency of the drive signals and the second signals applied by the Detector by Tuning Circuit 160. Tuning is accomplished by removing the Drill 58 and initiating the Signal Source 150. Tuning is adjusted until PLL locks on the frequency of the second output signals provided by the Dectector 156. When PLL locks on the frequency, its output switches on line 162 and causes the Indicator 164 to light. This switching is essentially a conversion to a digital signal level that is equivalent of the second disabling signals. Thereafter, when the numerically controlled drilling machine is put in operation, the occurrence of the output signal on line 162 from PLL will cause the Indicator 164 to light anytime the Drill 58 is detected to be missing, and will be applied to the Selector 166. The Selector is subject to the control of the Disable Circuit 168 via control line 170. A manual select signal is provided on line 172 and a Tool Control signal is applied on line 174 to the Disable Circuit 168. In order for the broken drill bit detector circuitry to operate, both of these control signals must be present or the Selector 166 will be disabled. When the Selector 166 is enabled, and a broken Drill bit is detected, it will provide a signal on line 176 to Time Delay circuitry 178. The time delay is selected to provide sufficient delay to prevent spurious signals from causing the numerically controlled drilling machine to be shut down. Such signals can be derived from skew of Drill 58 which straightens as it enters the Work Piece, thereby removing the signal indicative that the Drill is broken. If the Selector 166 continues to provide the signal on line 176 for a sufficient time specified by Time Delay 178, a signal is issued on line 180 to the Interface 182 for causing the numerically controlled drilling machine to be stopped in the present operating cycle. An external control on line 184 can disable the detection circuitry if desired.

The broken drill bit detector of the type just described is associated with each of the Spindles in a multiple-spindle drilling machine, as will be described in more detail below. The foregoing has been a functional description of the circuit interrelationships, and the detail circuitry utilized to implement a preferred embodiment will be described.

Figure 8A:
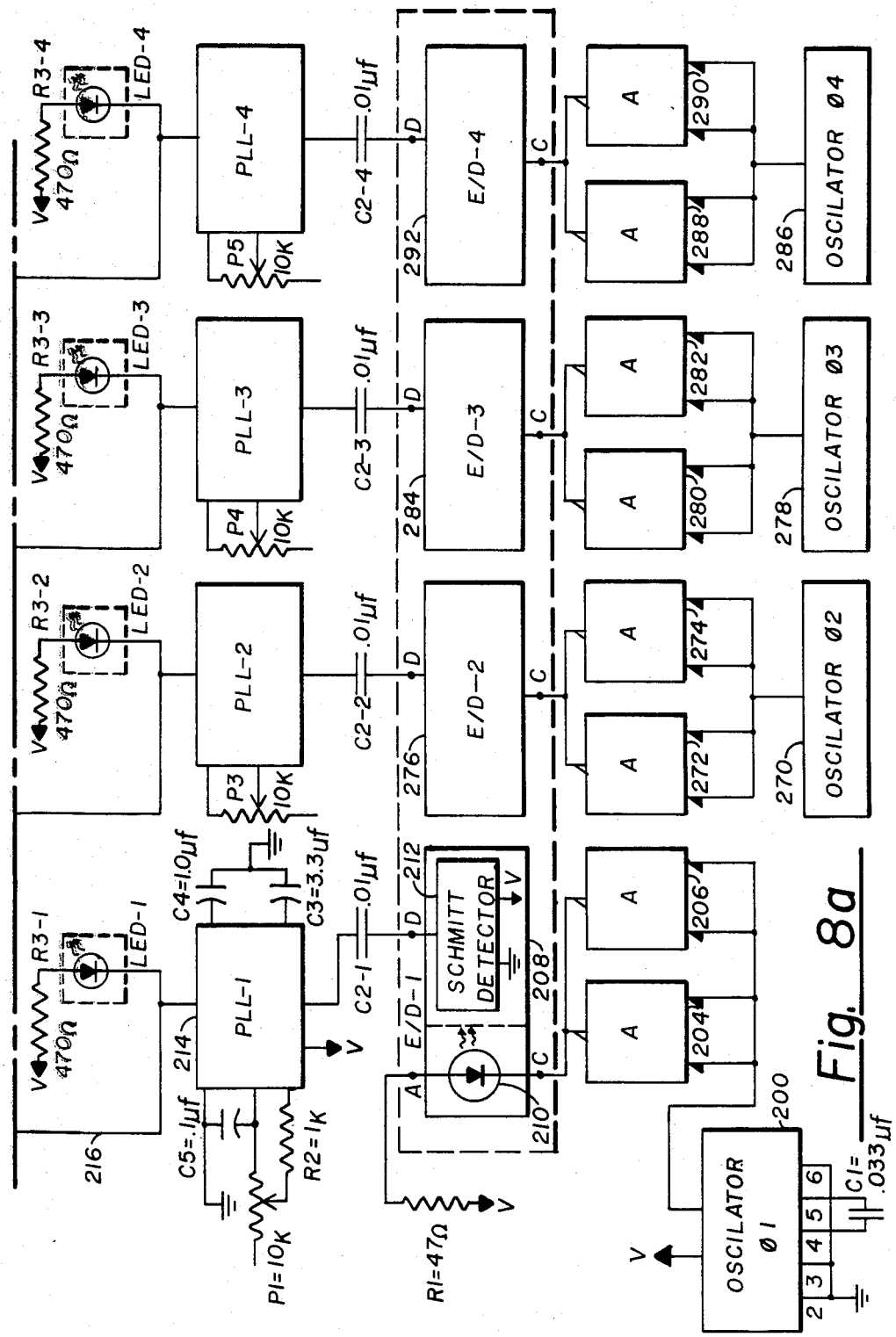

FIG. 8a through FIG. 8b, when arranged as shown in FIG. 8, comprise a logic circuit diagram of a preferred embodiment of the invention wherein multiple Emitter/Detector apparatus is utilized for controlling multiple Drill operations. It should be understood that the number of Emitter/Detector arrangements car be increased or decreased as desired for controlling the number of available Drill units.

The logic elements are all commercially available circuit and will be identified as to the logical function and the industry part number as encountered. The closed arrowhead indicates a high signal, or a logical one, and the open arrowhead indicates a low signal, or a logical zero. A single path of detection and control will be described in detail, and the multiple controls will be detailed to the extent necessary to understand the operation.

An Oscillator (OSC) 200 is selected to operate at a predetermined frequency $\emptyset1$ by the selection of the Capacitor C1, which for this circuit operation is 0.33 microfarads. The Oscillator is a 74S124 circuit and has a selected operation nominally of 1.2 kHz, with its output drive frequency being applied on line 202 to drivers 204 and 206, which can be circuit-type 74S38 and are parallel to provide the required drive signal to terminal C. The Emitter/Detector circuitry is shown enclosed in block 208 and utilizes an Infra Red Emitting Diode (IRED) 210 of a type previously identified, having the Cathode coupled to Terminal C and the Anode coupled to the Terminal A. Terminal A is coupled through Resistor R1 to a source of voltage and provides the power for the IRED. The IRED requires approximately 100 milliamperes for operation, which is driven by the drivers 204 and 206. When the signal at Terminal C goes negative with respect to the applied power, IRED passes current and emits light. The emitted light is carried through the Fiber Optic cable (not shown) and is directed to the Fiber Optic receiving cable (not shown) and is applied to the Schmitt Detector 212 which is of a type previously identified. The signal detected is applied through Capacitor C2-1 which is 0.01 microfarads, as an input signal to the Phase Lock Loop (PLL-1) 214. This circuitry utilizes Capacitor C3 of 3.3 microfarads, Capacitor C4 of 1.0 microfarads, Capacitor C5 of 0.1 microfarads and Resistor R2 of 1000 Ohms, in conjunction with Potentiometer P1 of 10,000 Ohms, to adjust PLL-1 to lock on the frequency of Oscillator 200. The adjustment is made by adjusting P1 to a point where PLL-1 locks on the frequency and causes a switching low of the output signal on line 216.

Light Emitting Diode (LED-1) has its cathode connected to line 216 and its Anode coupled through Resistor R3-1 of 470 Ohms to a source of power. When the output of PLL-1 goes low, the LED-1 conducts and emits a light visible at the Operator Control Panel. This light indicates that the circuit is tuned, and that the Drill is absent from the light path. The low output signal on line 216 is applied to Inverter (I) 218 which is a circuit-type 74LS04, which operates to provide a high output signal on line 220 in response to the received low input signal. When the wiper of Switch SW1 is coupled to ground, a low signal is impressed on line 222 as an input to Inverter 224 which is a circuit-type 74LS04. SW1 is located on the Operator Control Panel, and is associated with the motor control switch that drives Spindle 1. Capacitor C6-1 and Resistor R4-1 are utilized to provide filtering.

A high input AND 226 is essentially a gate and receives the enabling high signal on line 228 from Inverter 224 and the broken drill indicating signal on line 220 from Inverter 218. A control signal is applied on line 230 that indicates that the Drill is operative, said control signal being applied from the numerically controlled drilling machine. The occurrence of all three high signals at the input to gate 226 results in a low output signal on line 232. It can be seen, then, that if the Drill is shut down there will be a low signal impressed on line 230, thereby disabling gate 226. Similarly, if SW1 is open, there will be a low signal on line 228 thereby disabling gate 226.

High AND 234 is a selector that provides a low output signal on line 236 when all input signals are high. When gate 226 is selected, and a broken drill bit signal is provided, the low signal on line 232 will cause selector 234 to provide a high output signal on line 236. Circuit 234 can be a 74SL10 circuit.

High OR 238, which can be a type 74LS02 circuit, receives the input signal on line 236. This circuit operation is such that a low output signal will be provided on line 240 when either of the input signals is high. Accordingly, the high signal provided on line 236 will result in a low signal on line 240 which is applied to Inverter 242, which can be a type 74LS02. The output signal is coupled on line 244 as the input to Timer 246. The Timer can be a type 556 Timer and utilizes Capacitor C7 of 0.01 microfarads and Capacitor C8 of 0.47 microfarads in conjunction with Resistor R5 of 50,000 Ohms and Potentiometer P2 of one megohm, and diode CR1 to establish a time delay from the application of the input pulse until the output pulse occurs on line 248. A characteristic delay can be in the order of 100 milliseconds, and is utilized to provide a delay to allow for straightening of skew of the drill or other spurious signals to be ignored. The Timer is such that it requires the continued application of the input pulse on line 244 at the high level for sufficient period of time to satisfy the timing setting, before the low output signal will be provided on line 248. It can be seen, then, that if the signal on line 244 goes temporarily high but does not stay high for a sufficient timing period, the Timer will not provide the low output signal on line 248. This time allows sufficient interval for a Drill that is skewed but not broken to impact the work piece and straighten out to the extent that the broken drill bit signal will be removed.

The output from the Timer is applied to High OR circuit 250 which can be a circuit type 74LS02 and functions to provide a low output signal on line 252 if either of the input signals received on line 248 or 254 are high. Line 254 is coupled to the wiper of Switch SW2, which is mounted on the Control Panel and operates to enable or disable the broken drill bit detection. A source of positive power is coupled through Resistor R6 to SW2, and when the contact of the wiper is with the circuit path through Resistor R6, the detection will be disabled. The other contact of SW2 is coupled to Ground potential, which is the equivalent of a low signal, such that when the wiper of SW2 is in contact therewith an enable signal is provided on line 254. The low signal on line 254 essentially allows the signal applied on line 248 to govern the functioning of OR 250. When both input signals to OR 250 are low, thereby indicating that SW2 is enabled and a broken drill bit has been detected, a high output signal will be provided on line 252 to Inverter 255, which can be a type 74LS02 circuit. This high input signal will result in a low output signal on line 256 to a control terminal of Relay 258. The Relay can be a TECCOR#ECC D2410, and operates to provide a closed contact across output lines 260 and 262 so long as the input on line 256 is high. When the input on line 256 goes low, the internal coil (not shown) is deactivated and the terminal is allowed to open thereby providing an open circuit across lines 260 and 262. This open conditions passed to the AND circuit 40 (see FIG. 1) and is detected to be a signal that determines that the numerically controlled drilling machine must be stopped due to the fact that a broken drill bit has been detected.

For multiple detection circuits, Oscillators having different frequencies are utilized. For example, Oscillator $\emptyset2$ 270 is adjusted to provide a frequency that differs from $\emptyset1$ from at least 400 Hz. For example, if $\emptyset1$ is 1.2 kHz, $\emptyset2$ would be selected to be at least 1.6 kHz. These differences in frequency are required so that the Phase Lock Loop circuits PLL-1 and PLL-2 will differ sufficiently in their lock frequency so that they will function properly. The output from Oscillator 270 is applied to Drivers 272 and 274 which function to provide a drive frequency to input Terminal C of E/D-2 276. E/D-2 is similar to the combination of the IRED 210 and the Schmitt Detector 212 previously described and detects the presence or the absence of the Drill associated with Spindle 2. Oscillator $\emptyset3$ 278 is adjusted to provide a frequency that varies by at least 400 Hz from that of Oscillator $\emptyset2$. This frequency is applied to Drivers 280 and 282 which provide the requisite drive frequency to E/D-3 284. Similarly, Oscillator $\emptyset4$ 286 provides a frequency to Drivers 288 and 290 that is at least 400 Hz greater than $\emptyset3$. This drive frequency is applied to E/D-4 292 and is associated with the Drill in Spindle 4.

For this preferred embodiment, the fiber optic tubes are approximately 10 mils in diameter. In this arrangement, any drill of 10 mils or greater diameter will completely block the pulsed light between the emitter and the detector. It should be understood that drills of less than 10 mils can be utilized and breakage will still be detected, as indicated by the relationship illustrated in FIG. 5. For those drills of 10 mils or greater, the input frequency drive signals provided by Oscillators 200, 270, 278, and 286 will result in the respectively associated Schmidt Detector providing an essentially flat output signal when the associated drill is present. The absence of any of the drills will result in the associated frequency of light pulses being detected and applied as input signals to the respectively associated one of the Phase Lock Loop circuits PLL-1 through PLL-4 respectively. The tuning of PLL-2 is accomplished by Potentiometer P3 and results LED-2 lighting when it is tuned to the input frequency of Oscillator C2. Similarly, PLL-3 is tuned by Potentiometer P4 to the input frequency of Oscillator $\emptyset$P4 by P5. LED-3 and LED-4 operate for emitting light during tuning and for indicating the absence of respectively associated drills.

In a similar manner to that described above, Gate 300 is enabled by a signal received on line 302 from Inverter 304 indicative of the presence or absence of the drill associated with Spindle 2. SW3 enables Inverter 306 in a manner similar to that described for Inverter 224. The Tool Signal received on line 230 is applied to all like-ordered gate circuits 226, 300, 308, and 310. The output of Gate 300 is applied on line 312 as the other input to High AND 234, and will result in circuit operation from that point on similar to that previously described.

The functioning of SW4 and SW5 in conjunction with Inverters 314 and 316 respectively is similar to that described for Inverters 224 and 306. Similarly, the functioning of Gates 308 and 310 is similar to that described for Gate 226 and 300. The functioning of High AND circuit 318 for purposes of providing signals on line 320 is identical to that described for High AND circuit 234.

All discrete components described are available commercially, and circuit elements described as logic block diagrams symbols are commercially available components. The power source V is normally +5 volts d.c. for this embodiment.

Figure 9:
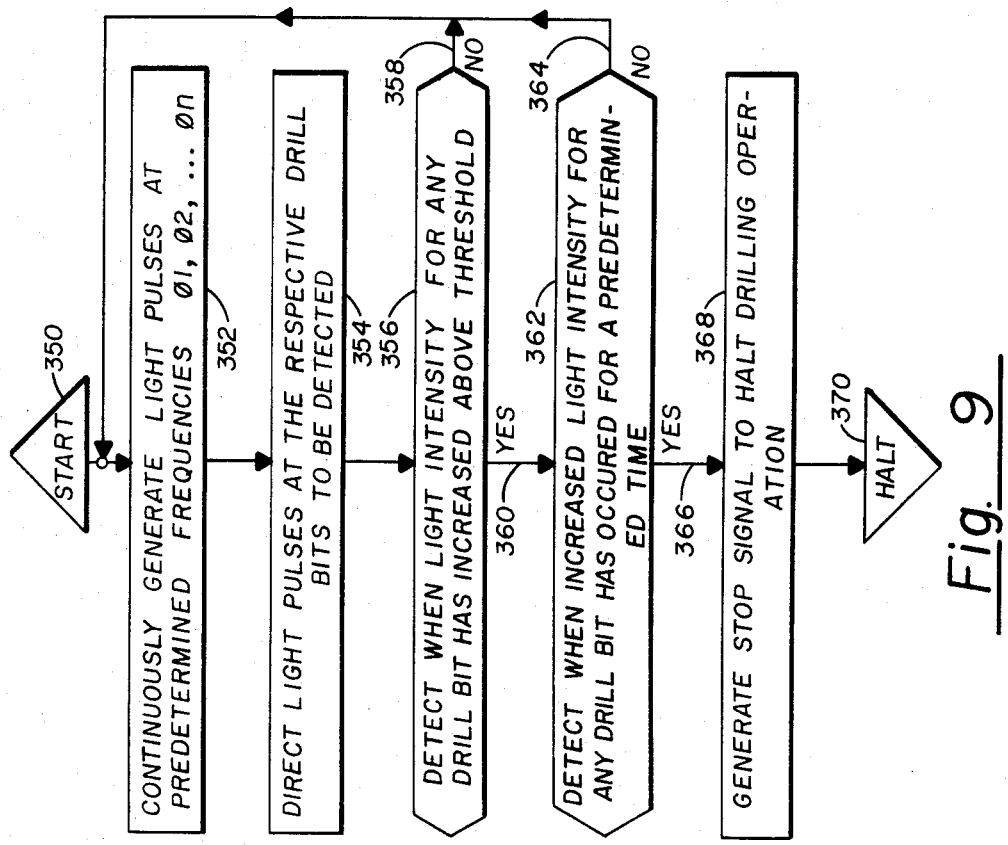
FIG. 9 is a flow diagram of the method of the invention.

FIG. 9 is a flow chart of a method of detecting broken or missing drill bits. After the start 350, continuously generate light pulses at predetermined frequencies $\emptyset 1, \emptyset 2, \ldots \emptyset n$, as indicating by block 352. If only one drill bit is to be detected, only one set of light pulses at a single predetermined frequency will be utilized. Direct the light pulses at the respective drill bits to be determined, as indicated by block 354. Detect when light intensity for any drill bit being detected as increased above a predetermined threshold as indicated by decision element 356. As long as the light intensity is below the predetermined threshold, the "No" path 356 is taken and there is simply continued generation of the light pulses. When it is detected for any Drill Bit being sensed, that the light intensity has increased above the predetermined threshold, the "Yes" path 360 is taken. Detection of the change in light intensity is then timed for occurrence for a predetermined time interval as indicated by decision element 362. If the light intensity switches below the predetermined threshold during the predetermined time interval, the "No" path 364 is taken and no drilling machine operation interruption occur. When the light intensity has increased above the threshold for the predetermined time, the "Yes" path 366 is taken, and a stop signal for halting a drilling operation is generated, as indicated by block 368. At that point the method is caused to Halt 370 until repair or replacement occurs and the system is deactivated.

In view of the foregoing description of the inventive concepts, consideration of the drawings, and description of the preferred embodiment, it can be seen at the various stated purposes and objectives of the invention have been met. Without departing from the spirit and scope of the invention, what was intended to be protected by Letters Patent is set forth in the appended claims.

What is claimed is:

1. For use in a numerically controlled drilling machine having control apparatus for positioning a work piece to be drilled and controlling the actuation of a drilling function in cycles, a drill bit detector comprising:

emitter means for directing a source of energy in the vicinity of a drill bit to be detected, said emitter means including signal source means for providing drive signals at a predetermined frequency, and light emitting means coupled to said signal source means for emitting pulses of light energy, said pulses occurring with a frequency substantially equivalent to said predetermined frequency of said drive signals toward the drill bit;

detector means oppositely disposed and responsively associated with said emitter means for receiving first energy level signals when the drill bit to be detected is present and second energy level signals when said drill bit is absent, wherein said detector means includes energy detecting circuit means for providing said second energy level signals at the frequency of emitted ones of said pulses of light energy when the drill bit is missing;

control circuit means coupled to said detector means for providing disable signals in response to said second level energy signals for disabling the control apparatus of said numerically controlled drilling machine for stopping operation immediately upon detection of the absent drill bit, said control circuit means including frequency responsive means for providing said disable signals in response to said second energy level signals from said detector means and for providing enabling signal in response to said first energy level signals, wherein said frequency responsive means includes phase lock loop means responsive to signals at an amplitude sufficient to be detected and occurring at said frequency for locking on and switching it output to provide said disable signals and tuning means for tuning said phase lock loop means to be responsive to signals detected by said detector means at said predetermined frequency; and timer means coupled to said frequency responsive means and responsive to said disable signals for passing said disable signal to the numerically controlled drilling machine control apparatus when said disable signal continuously occur for a predetermined threshold time interval, whereby said disable signals occurring for less than said threshold time are ignored as spurious and the operation of the numerically controlled drilling machine is not interrupted.

2. A drill bit detector as in claim 1, wherein said timer means has said predetermined threshold time interval in the order of one hundred milliseconds.

3. For use in detecting broken or missing drill bits in numerically controlled drilling machines the method of:
A. generating light pulses at a predetermined frequency of pulses;
B. directing said light pulses at a predetermined portion of a drill bit to be detected;
C. detecting changes of light intensity occurring when the drill bit is broken or missing;
D. providing control signals at said predetermined frequency indicative of the detected change in light intensity;
E. selecting a predetermined time interval that said control signals must be present to accurately indicate the detected drill bit is broken or missing;
F. timing the occurrence of said control signals;
G. enabling the issuance of stop signal after said predetermined time interval has elapsed provided said control signal is still present; and
H. generating said stop signals in response to said control signals for causing the numerically controlled drilling machine to be stopped in response thereto.

4. For use in detecting which one of a plurality of drill bits is broken or missing in a numerically controlled drilling machine, the method of claim 3 and further including the steps of:
A. selecting a different predetermined frequency for generation of light pulses for each of the drill bit positions to be sensed;
B. generating light pulses at each of said selected frequencies;
C. directing each of said plurality of light pulses generated at said predetermined differing frequencies at respectively associated ones of the drill bits to be detected;

D. sensing each of said plurality of light pulses at respectively associated frequencies and generating control signals indicative of sensed change in light intensity whereby each broken or missing drill bit is identified; and E. generating said stop signals in response to said control signals for stopping the operation of the numerically controlled drilling machine in response thereto.

5. For use with a numerically controlled drilling machine broken or missing drill bit detector cpable of detecting drill bits of less than 30 mils diameter comprising:

support means for mounting to the numberically controlled drilling machine in the vicinity of the drill bit to be detected;

emitter means for emitting pulsed light at a predetermined frequency mounted to said support means, wherein said emitter means includes oscillator means for providing drive signals at a predetermined frequency, and infrared emitting diode means coupled to said oscillator means for providing light pulses at said predetermined frequency;

first optical means coupled to said emitter means for focusing said pulsed light at a predetermined portion of the drill bit to be detected, wherein said first optical means includes fiber optical means having a first end coupled to said emitter means and a second end mounted in a predetermined relationship to the drill bit to be detected;

second optical means in predetermined relationship to said first optical means for receiving light not blocked by the drill bit being detected, wherein said second optical means includes second fiber optic means having a first end coupled to said detector means and a second end mounted in axial alignment with said second end of said first fiber optic means;

detector means coupled to said second optical means for detecting changes in light intensity occurring when the detected drill bit is not present in the path of said pulsed light, and including control signal generating means for generating first control signals when said drill bit is present and second control signals when said drill bit is missing in response to said sensed change in light intensity, said detector means mounted on said support means, wherein said detector means includes trigger circuit means for providing electrical signals at said predetermined frequency, the amplitude of said electrical signals being dependent upon the intensity of the light pulses detected, and phase lock loop means responsively coupled to said trigger circuit means and tuned to said predetermined frequency for generating said first control signals when the amplitude of said electrical signals is less than a predetermined threshold, and for providing said second control signals when the amplitude of said electrical signals is greater than said threshold value and at said predetermined frequency, thereby said second control signal indicating that the drill bit being sensed is missing;

control signal conductor means for carrying said first and second control signals to control circuitry in the numerically controlled drilling machine;

power conductor means coupled to said emitter means and said detector means for receiving power and applying it thereto; and timer means coupled to said phase lock loop means for enabing said second control signals to said control signal conductor means when said second control signal from said phase lock loop means has occurred for a predetermined time interval, whereby said second control signals occurring for less than said predetermined time interval are ignored as spurious and operation is not interrupted.

6. For use in a numerically controlled drilling machine having multiple drill spindles, control apparatus for positioning a work piece to be drilled and controlling the actuation of a drilling function in cycles, a drill bit detector comprising:

a plurality of emitter means for directing a source of energy in the vicinity of each of the drill bits to be detected, each of said emitter means including signal source means for providing drive signals at a predetermined frequency different from the frequencies of all other signal source means, and light emitting means coupled to said signal source means for emitting pulses of light energy, said pulses occurring with a frequency substantially equivalent to the said predetermined frequency of said drive signals from the associated on of said signal source means;

a plurality of detector means each oppositely disposed and responsively associated with a different one of said emitter means for receiving a first energy level when the drill bit to be detected is present and a second level of energy when said associated drill bit is absent, and wherein each of said detector means includes energy detecting circuit means for providing said second level signals at the frequency of said emitted energy pulses associated therewith when the drill bit is missing; and a plurality of control circuit means and coupled to one of said detector means for providing disable signals in response to said second energy level for disabling the control apparatus of said numerically controlled drilling machine for stopping operation immediately upon detection of the absent drill bit, wherein each of said control circuit means includes frequency responsive means responsively tuned to the frequency of said emitted energy pulses associated therewith for providing said disable signals in response to said second level signals from said detector means and for providing enabling signals in response to said first level signals, whereby said enabling signal allow said numerically controlled drilling machine to continue operation and said disabling signals are utilized to cause said numerically controlled drilling machine to stop operation each of said frequency responsive means includes phase lock loop means responsive to signals at an amplitude sufficient to be detected and occurring at said associated frequency for locking on and switching its output to provide said disable signal;

tuning means for tuning each of said phase lock loop means to be responsive to signals detected by said detector means at said associated predetermined frequency; and timer means coupled to said frequency responsive means and responsive to said disable signals for passing said disable signals to the numerically controlled drilling machine control apparatus when said disable signals continuous occur for a predetermined threshold time interval, whereby said disable signals occurring for less than said threshold time are ignored as spurious and the operation of the numerically controlled drilling machine is not interrupted.

* * * * *

UNITED STATES PATENT AND TRADEMARK OFFICE
CERTIFICATE OF CORRECTION

PATENT NO. : 4,502,823

DATED : March 5, 1985

INVENTOR(S) : Steve Wronski, John E. Albright, and Jeffrey J. Carlson

It is certified that error appears in the above-identified patent and that said Letters Patent are hereby corrected as shown below:

Claim #1, Column #14, Lines 24 and 26, "signal" should be -- signals --.

Claim #5, Column #15, Line 13, "cpable" should be -- capable --.

Line 16, "numberically" should be -- numerically --.

Line 29, "optical" second occurrence should be --optic--.

Claim #6, Column #16, Line 24, "on" should be -- one --.

Line 66 "continuous" should be -- continuously --.

Signed and Sealed this

Ninth Day of July 1985

[SEAL]

Attest:

DONALD J. QUIGG

Attesting Officer     Acting Commissioner of Patents and Trademarks